(12) United States Patent
Fuller et al.

(10) Patent No.: US 11,265,201 B2
(45) Date of Patent: Mar. 1, 2022

(54) CORRECTION OF SPECIFIC INTERMODULATION PRODUCTS IN A CONCURRENT MULTI-BAND SYSTEM

(71) Applicant: Telefonaktiebolaget LM Ericsson (publ), Stockholm (SE)

(72) Inventors: Arthur Thomas Gerald Fuller, Kanata (CA); Mark Edward Rollins, Stittsville (CA)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 16 days.

(21) Appl. No.: 16/641,180

(22) PCT Filed: Aug. 30, 2017

(86) PCT No.: PCT/IB2017/055225
§ 371 (c)(1),
(2) Date: Feb. 21, 2020

(87) PCT Pub. No.: WO2019/043434
PCT Pub. Date: Mar. 7, 2019

(65) Prior Publication Data
US 2021/0144046 A1    May 13, 2021

(51) Int. Cl.
*H04L 27/36*   (2006.01)
*H03F 1/32*    (2006.01)
(Continued)

(52) U.S. Cl.
CPC ......... *H04L 27/368* (2013.01); *H03F 1/3258* (2013.01); *H03F 3/213* (2013.01);
(Continued)

(58) Field of Classification Search
CPC ..... H04L 27/368; H03F 1/3258; H03F 3/213; H03F 2201/3221; H03F 2200/451; H04B 2001/0425; H04B 2001/0433
(Continued)

(56) References Cited

U.S. PATENT DOCUMENTS 8,634,494 B2   1/2014  Bai
9,252,718 B2   2/2016  Laporte et al.
(Continued)

FOREIGN PATENT DOCUMENTS

CN   102938638 B    4/2015
WO   2016203294 A1  12/2016

OTHER PUBLICATIONS

Abdelaziz, Mahmoud, et al., "Low-Complexity Subband Digital Predistortion for Spurious Emission Suppression in Noncontiguous Spectrum Access," IEEE Transactions on Microwave Theory and Techniques, vol. 64, No. 11, Nov. 2016, pp. 3501-3517 (Year: 2016).*

(Continued)

*Primary Examiner* — Kevin M Burd
(74) *Attorney, Agent, or Firm* — Withrow & Terranova, PLLC

(57) ABSTRACT

Systems and methods are disclosed herein for selectively compensating for a specific Intermodulation Distortion (IMO) product(s) of an arbitrary order in a transmitter system. In some embodiments, a method of compensating for one or more specific IMO products in a concurrent multi-band transmitter system comprises generating an IMO correction signal for a specific IMO product as a function of two or more frequency band input signals for two or more frequency bands of a concurrent multi-band signal, the IMO product being an arbitrary order IMD product. The method further comprises frequency translating the IMD correction (Continued)

signal to a desired frequency that corresponds to a Radio Frequency (RF) location of the specific IMO product and, after frequency translating the IMO correction signal to the desired frequency, utilizing the IMO correction signal to compensate for the specific IMO product.

21 Claims, 13 Drawing Sheets

(51) Int. Cl.
    *H03F 3/213*     (2006.01)
    *H04B 1/04*     (2006.01)

(52) U.S. Cl.
    CPC .......... *H04B 1/04* (2013.01); *H03F 2200/451* (2013.01); *H03F 2201/3221* (2013.01); *H04B 2001/0425* (2013.01); *H04B 2001/0433* (2013.01)

(58) Field of Classification Search
    USPC ............................... 375/296, 297; 455/114.3
    See application file for complete search history.

(56) References Cited

U.S. PATENT DOCUMENTS

| | | | |
|---|---|---|---|
| 9,385,762 | B2 | 7/2016 | Laporte et al. |
| 9,641,204 | B2 | 5/2017 | Ghannouchi et al. |
| 2008/0042742 | A1* | 2/2008 | Linder .............. H03F 1/22 327/562 |
| 2014/0191799 | A1 | 7/2014 | Ohkawara et al. |
| 2015/0049841 | A1* | 2/2015 | Laporte .............. H03F 1/34 375/297 |
| 2017/0201368 | A1* | 7/2017 | Hou ................. H04B 1/48 |

OTHER PUBLICATIONS

Yu, Hai, et al., "Automatic Feed-Forward Cancellation of Modulated Harmonic," 86th ARFTG Microwave Measurement Conference, Atlanta, GA, 2015, 3 pages. (Year: 2015).*

Abdelaziz, Mahmoud, et al., "Low-Complexity Subband Digital Predistortion for Spurious Emission Suppression in Noncontiguous Spectrum Access," IEEE Transactions on Microwave Theory and Techniques, vol. 64, No. 11, Nov. 2016, pp. 3501-3517.

Abdelhafiz, Abubaker, et al., "Augmented Dual-Band Digital Predistorter for Reducing Cross-Band Intermodulation Distortion Using Predictive Injection Technique," IEEE Transactions on Microwave Theory and Techniques, vol. 64, No. 11, Nov. 2016, pp. 3518-3527.

Bassam, Seyed Aidin, et al., "Channel-Selective Multi-Cell Digital Predistorter for Multi-Carrier Transmitters," IEEE Transactions on Communications, vol. 60, No. 8, Aug. 2012, pp. 2344-2352.

Liu, You-Jiang, et al., "Digital Predistortion for Concurrent Dual-Band Transmitters Using 2-D Modified Memory Polynomials," IEEE Transactions on Microwave Theory and Techniques, vol. 61, No. 1, Jan. 2013, pp. 281-290.

Morgan, Dennis R., et al., "A Generalized Memory Polynomial Model for Digital Predistortion of RF Power Amplifiers," IEEE Transactions on Signal Processing, vol. 54, No. 10, Oct. 2006, pp. 3852-3860.

Naraharisetti, Naveen, et al., "2D Cubic Spline Implementation for Concurrent Dual-Band System," IEEE MTT-S International Microwave Symposium Digest (MTT), Seattle, WA, 2013, 4 pages.

Naraharisetti, Naveen, et al., "Efficient Least-Squares 2-D-Cubic Spline for Concurrent Dual-Band Systems," IEEE Transactions on Microwave Theory and Techniques, vol. 63, No. 7, Jul. 2015, pp. 2199-2210.

Yu, Hai, et al., "Automatic Feed-Forward Cancellation of Modulated Harmonic," 86th ARFTG Microwave Measurement Conference, Atlanta, GA, 2015, 3 pages.

Yu, Chao, et al., "Modeling and Suppression of Transmitter Leakage in Concurrent Dual-band Transceivers with Carrier Aggregation," IEEE MTT-S International Microwave Symposium, Phoenix, AZ, 2015, 3 pages.

International Search Report and Written Opinion for International Patent Application No. PCT/IB2017/055225, dated May 2, 2018, 18 pages.

* cited by examiner

FIG. 1
*(Prior Art)*

| C2\C1 | -6 | -5 | -4 | -3 | -2 | -1 | 0 | 1 | 2 | 3 | 4 | 5 | 6 |
|---|---|---|---|---|---|---|---|---|---|---|---|---|---|
| -8 | -12218 | -11459 | -10700 | -9941 | -9182 | -8423 | -7664 | -6905 | -6146 | -5387 | -4628 | -3869 | -3110 |
| -7 | -11260 | -10501 | -9742 | -8983 | -8224 | -7465 | -6706 | -5947 | -5188 | -4429 | -3670 | -2911 | -2152 |
| -6 | -10302 | -9543 | -8784 | -8025 | -7266 | -6507 | -5748 | -4989 | -4230 | -3471 | -2712 | -1953 | -1194 |
| -5 | -9344 | -8585 | -7826 | -7067 | -6308 | -5549 | -4790 | -4031 | -3272 | -2513 | -1754 | -995 | -236 |
| -4 | -8386 | -7627 | -6868 | -6109 | -5350 | -4591 | -3832 | -3073 | -2314 | -1555 | -796 | -37 | 722 |
| -3 | -7428 | -6669 | -5910 | -5151 | -4392 | -3633 | -2874 | -2115 | -1356 | -597 | 162 | 921 | 1680 |
| -2 | -6470 | -5711 | -4952 | -4193 | -3434 | -2675 | -1916 | -1157 | -398 | 361 | 1120 | 1879 | 2638 |
| -1 | -5512 | -4753 | -3994 | -3235 | -2476 | -1717 | -958 | -199 | 560 | 1319 | 2078 | 2837 | 3596 |
| 0 | -4554 | -3795 | -3036 | -2277 | -1518 | -759 | 0 | 759 | 1518 | 2277 | 3036 | 3795 | 4554 |
| 1 | -3596 | -2837 | -2078 | -1319 | -560 | 199 | 958 | 1717 | 2476 | 3235 | 3994 | 4753 | 5512 |
| 2 | -2638 | -1879 | -1120 | -361 | 398 | 1157 | 1916 | 2675 | 3434 | 4193 | 4952 | 5711 | 6470 |
| 3 | -1680 | -921 | -162 | 597 | 1356 | 2115 | 2874 | 3633 | 4392 | 5151 | 5910 | 6669 | 7428 |
| 4 | -722 | 37 | 796 | 1555 | 2314 | 3073 | 3832 | 4591 | 5350 | 6109 | 6868 | 7627 | 8386 |
| 5 | 236 | 995 | 1754 | 2513 | 3272 | 4031 | 4790 | 5549 | 6308 | 7067 | 7826 | 8585 | 9344 |
| 6 | 1194 | 1953 | 2712 | 3471 | 4230 | 4989 | 5748 | 6507 | 7266 | 8025 | 8784 | 9543 | 10302 |
| 7 | 2152 | 2911 | 3670 | 4429 | 5188 | 5947 | 6706 | 7465 | 8224 | 8983 | 9742 | 10501 | 11260 |
| 8 | 3110 | 3869 | 4628 | 5387 | 6146 | 6905 | 7664 | 8423 | 9182 | 9941 | 10700 | 11459 | 12218 |

CORRECTION OF SPECIFIC INTERMODULATION PRODUCTS IN A CONCURRENT MULTI-BAND SYSTEM

This application is a 35 U.S.C. § 371 national phase filing of International Application No. PCT/IB2017/055225, filed Aug. 30, 2017, the disclosure of which is incorporated herein by reference in its entirety.

TECHNICAL FIELD

The present disclosure relates to a concurrent multi-band transmitter and, in particular, to correction of an Intermodulation Distortion (IMD) product in a concurrent multi-band transmitter.

BACKGROUND

Digital Predistortion (DPD) employs Digital Signal Processing (DSP) techniques to impress an "inverse characteristic" of the Power Amplifier (PA) on the transmitted signal to compensate for the non-linear distortion thereby introduced. Typically, the distortion function is modeled as a sum of output signals produced from (non-orthogonal) basis functions weighted by a corresponding set of complex-valued tap coefficients as in the Generalized Memory Polynomial (GMP) framework of [1].

Recent advanced transmitter architectures target the capability to service signals in multiple bands concurrently as a means to lower cell site cost and complexity. Concurrent dual-band systems require DPD with much higher computational complexity since nonlinear behavior of concurrent dual-band PAs includes both intra-band and inter-band (cross-band) distortion products. Concurrent dual-band DPD requires extension to two dimensions (i.e., Two Dimensional DPD (2D-DPD)) leading to costly increases in computational complexity for GMP schemes [2] or to impractical memory depths for techniques based on Lookup Tables (LUTs) [3]. Recently, a flexible architecture has been proposed based on overlapping splines [4] and a closed-loop Least Mean Square (LMS) adaptation procedure [4] to solve these issues.

In some dual-band (or multi-band) configurations, it is not only necessary to correct the distortion centered around the carriers in each band, but also some of the Intermodulation Distortion (IMD) products. These IMD products fall at integer multiples of the band frequencies, as well as frequencies related to the sum and difference of the band frequencies and their multiples. For a dual-band scenario, the frequency location of these IMD products can be denoted by:

Equation 1—IMD Frequency Location $$f_{IMD} = c_1 f_1 + c_2 f_2,$$

where $f_1$ and $f_2$ are the center frequencies of a first band and a second band, respectively, and $c_1$ and $c_2$ are signed integer valued coefficients. Note that the order of the IMD product is given by:

Equation 2—IMD Order $$\text{Order}_{IMD} = \Sigma |c_i|.$$

As an example, consider a dual-band configuration with a first band centered at $f_1 = 759$ megahertz (MHz) and a second band centered at $f_2 = 958$ MHz. The potential IMD product locations are calculated and presented in FIG. 1 (up to the fourteenth order). As can be seen from FIG. 1, several high-order IMD products (represented by bold boxes) fall close enough to the main carrier locations (represented by the bold numbers) that they may require some form of correction.

The predistortion implications of IMD products can be better understood by considering the mathematical formulation of a simple example. Let a simple third order nonlinear (baseband) system be described as:

Equation 3—Simple Third Order Nonlinearity $$y(n) = x^2(n) x^*(n),$$

where $y(n)$ is the system output and $x(n)$ is the system input. For a dual-band system, the input signal is given by:

Equation 4—Dual-band Input Signal $$x(n) = x_1(n) e^{j\omega_1 n} + x_2(n) e^{j\omega_2 n},$$

where $x_1(n)$ and $x_2(n)$ are the input signals for a first band and a second band, respectively, and where $\omega_1$ and $\omega_2$ are the digital frequency variables that describe the frequency location of each band. Then, the system output in terms of the individual band inputs can be obtained by substituting Equation 4 into Equation 3 in accordance with:

Equation 5—Dual-Band System Output Equation $$y(n) = x_1^2(n) x_1^*(n) e^{j\omega_1 n} + 2x_1(n) x_2(n) x_2^*(n) e^{j\omega_1 n} + x_1^2(n) x_2^*(n) e^{j(2\omega_1 - \omega_2)n} + x_2^2(n) x_1^*(n) e^{j(-\omega_1 + 2\omega_2)n} + 2x_1(n) x_2(n) x_1^*(n) e^{j\omega_2 n} + x_2^2(n) x_2^*(n) e^{j\omega_2 n}$$

From Equation 5, it can be observed that the distortion in each band is not only a function of that band's input, but is also a function of the other band. Moreover, third order IMD (IMD3) products are located at $2f_1 - f_2$ and $2f_2 - f_1$ and are a function of both band inputs.

It is important to note that "simple" odd-order IMD products that satisfy the requirement:

Equation 6—Simple Odd-Order Relationship $$c_i + c_j = 1,$$

maintain their frequency position relative to the band frequencies even if the band frequencies are translated by a constant offset (e.g., from Radio Frequency (RF) to baseband). However, this is not true for any even-order products or other odd-order products that do not satisfy Equation 6. In conventional DPD systems, signals are often translated to/from their absolute frequency location to a baseband location (e.g., located around 0 hertz (Hz)). Consequently, only "simple" odd-order IMD products generated in a baseband DPD system will be in the correct frequency location when the DPD output is translated back to the appropriate frequency location for transmission. Other types of IMD products could be individually filtered and translated separately to appropriate absolute frequencies, but this would result in increased computational complexity.

A traditional baseband DPD architecture is illustrated in FIG. 2. In this architecture, the signals for each band are combined into a single composite signal that is used as an input to the DPD function. This composite signal is placed at baseband (centered at 0 Hz). Architectures of this type face a number of challenges in the correction IMD products:

They can only address simple odd-order IMD products as described above because they are based on the translation of the input and output signals to baseband (centered at 0 Hz).

They must operate at high sampling rates in order to have sufficient bandwidth to cover all the IMD products to be corrected. This results in an increased computational complexity.

They cannot focus on a particular IMD product (e.g., $6f_1 - 4f_2$), but must generate a large number of higher order terms that contribute at the given IMD location.

This increases the computational complexity and may generate correction terms that are not required.

Another baseband DPD architecture is a multi-dimensional DPD architecture as illustrated in FIG. 3. Examples of a multi-dimensional DPD architecture are described in [4] [5][7]. In this architecture, the overall DPD "problem" is decomposed into separate DPD actuators for each band, as shown in FIG. 3 which gives an example for a dual band system. Note that each band actuator has multiple inputs (one per band). Consequently, the underlying basis functions are multi-dimensional, with a dimension per input signal (e.g., a dual band system uses 2D basis functions). The advantage of this type of architecture is that computational resources are focused on the particular bands of interest. However, the conventional application of this architecture does not support the correction of IMD products.

Yet another baseband DPD architecture is a "channel-selective" DPD architecture. An example is described in [6]. This architecture is based on the multi-dimensional DPD architecture described above, but with additional processing blocks after the DPD actuators for each band. This architecture is illustrated in FIG. 4.

In the channel-selective DPD architecture, the cancellation of IMD products is based on injecting a signal, with equal magnitude but 180° degree phase shift compared to the generated IMD3 product terms, into the input of the of the transmitter. As such, the outputs of DPD actuators for the main signal bands (C2 and C3 in FIG. 4) are tuned and combined at a higher sampling rate to create a composite signal. Then, a nonlinearity is applied to the composite signal in order to generate IMD products. The desired IMD products are selected via filtering and then adjusted by a gain and phase rotation to achieve the desired cancellation term. This is accomplished in processing blocks C1 and C4 as shown in FIG. 4.

Architectures of this type face several challenges in the correction IMD products:

Only the cancellation of IMD3 (third order) products is considered.

They must operate at high sampling rates to have sufficient bandwidth to generate the IMD products to be corrected and must also use a large number of nonlinear terms to generate the desired IMD products. This results in an increased computational complexity.

This architecture encapsulates the predistortion/correction of the main signal bands and the IMD products. It does not provide a method to only correct the IMD products in support of a preexisting DPD system.

Another similar technology is modeling and suppressing transmitter leakage in a concurrent dual-band system, as described in [7]. This architecture is focused on the cancellation of IMD3 products from a dual-band configuration in the receiver of a radio. A high-level view of the architecture is given in FIG. 5. The IMD3 product is modeled and weighted with an envelope dependent nonlinearity and then subtracted from the receive signals as shown in FIG. 6. Architectures of this type face a few challenges in the correction IMD products:

Does not correct distortions in the transmitter path (only the receiver); and

Only the cancellation of simple IMD3 (third-order) products for a dual-band configuration is considered.

Another architecture for DPD is an "augmented" dual-band DPD with predictive injection as described in [8]. In this architecture, the IMD products are addressed using a "predictive injection" technique. A high-level overview of the architecture is given in FIG. 7. Without directly observing the specific IMD products in a feedback loop, approximations are synthesized (in modules Tx 2 and Tx 3) and injected into the transmitter. Architectures of this type face several challenges in the correction IMD products:

They only consider simple odd-order IMD products.

This architecture predicts, but does not directly observe or adapt, based on observations of the IMD products to be cancelled. Consequently, cancellation performance can be limited.

This approach is only intended to work in conjunction with an underlying multi-dimensional DPD system (i.e., cannot be used in conjunction with a traditional baseband DPD system).

Thus, there is a need for a DPD architecture that addresses the shortcomings of the existing DPD architectures described above.

SUMMARY

Systems and methods are disclosed herein for selectively compensating for a specific Intermodulation Distortion (IMD) product(s) of an arbitrary order in a concurrent multi-band transmitter system. In some embodiments, a method of compensating for one or more specific IMD products in a concurrent multi-band transmitter system comprises generating an IMD correction signal for a specific IMD product as a function of two or more frequency band input signals for two or more frequency bands of a concurrent multi-band signal, the IMD product being an arbitrary order IMD product. The method further comprises frequency translating the IMD correction signal to a desired frequency that corresponds to a Radio Frequency (RF) location of the specific IMD product and, after frequency translating the IMD correction signal to the desired frequency, utilizing the IMD correction signal to compensate for the specific IMD product.

In some embodiments, the IMD product is a non-simple odd-order IMD product. In some other embodiments, the IMD product is an even-order IMD product.

In some embodiments, generating the IMD correction signal for the specific IMD product comprises generating the IMD correction signal for the specific IMD product in accordance with:

$$\text{IMD\_PRODUCT}(n) = AB,$$

where $$A = [\Pi_{i=1}^{N} \hat{x}_i^{|c_i|}(n - d_i)],$$

$$B = [\Sigma_{j=1}^{M} \varphi_j \beta_j \{|x_1(n - \tilde{d}_1)|, |x_2(n - \tilde{d}_2)|, \ldots, |x_N(n - \tilde{d}_N)|\}],$$

$c_i$ are signed integer values that define the specific IMD product, $d_i$ is a parameter that controls relative delay of the two or more frequency band input signals, $\tilde{d}_i$ is a parameter that controls relative delay of envelope signals for the two or more frequency band input signals, $\beta_j$ is an N-dimensional basis function set with M members that span a respective N-dimensional input space, $\varphi_j$ are complex coefficients for each set member of the N-dimensional basis function set, and $$\hat{x}_i(n) = \begin{cases} x_i(n) \text{ for } c_i \geq 0, \\ x_i^*(n) \text{ for } c_i < 0. \end{cases}$$

Further, in some embodiments, frequency translating the IMD correction signal to the desired frequency that corresponds to the RF location of the specific IMD product comprises frequency translating the IMD correction signal to the desired frequency that corresponds to the RF location of the specific IMD product in accordance with:

$$FREQ\_TRANS\_IMD\_PRODUCT(n) = ABe^{j(c_1\omega_1 + c_2\omega_2 + \ldots + c_N\omega_N)n},$$

where $\omega_i$ are digital frequency variables that define a frequency location of each frequency band and the weighted sum of $c_i\omega_i$ define the desired frequency to which the IMD correction signal is translated.

In some embodiments, generating the IMD correction signal for the specific IMD product comprises generating a plurality of component signals of the IMD correction signal for the specific IMD product, each component signal of the plurality of component signals being generated in accordance with:

$$IMD\_PRODUCT\_COMPONENT(n) = AB,$$

where $$A = [\Pi_{i=1}^{N} \hat{x}_i^{|c_i|}(n-d_i)],$$

$$B = [\Sigma_{j=1}^{M} \varphi_j \beta_j \{|x_1(n-\tilde{d}_1)|, |x_2(n-\tilde{d}_2)|, \ldots, |x_N(n-\tilde{d}_N)|\}],$$

$c_i$ are signed integer values that define the specific IMD product, $d_i$ is a parameter that controls relative delay of the two or more frequency band input signals, $\tilde{d}_i$ is a parameter that controls relative delay of envelope signals for the two or more frequency band input signals, $\beta_j$ is an N-dimensional basis function set with M members that span a respective N-dimensional input space, $\varphi_j$ are complex coefficients for each set member of the N-dimensional basis function set, $$\hat{x}_i(n) = \begin{cases} x_i(n) \text{ for } c_i \geq 0, \\ x_i^*(n) \text{ for } c_i < 0, \end{cases}$$

and values of $d_i$ and $\tilde{d}_i$ are different for each component signal of the plurality of component signals. Generating the IMD correction signal for the specific IMD product further comprises combining the plurality of component signals to provide the IMD correction signal for the specific IMD product. Further, in some embodiments, frequency translating the IMD correction signal to the desired frequency that corresponds to the RF location of the specific IMD product comprises frequency translating the IMD correction signal to the desired frequency that corresponds to the RF location of the specific IMD product in accordance with:

$$FREQ\_TRANS\_IMD\_PRODUCT(n) = ABe^{j(c_1\omega_1 + c_2\omega_2 + \ldots + c_N\omega_N)n},$$

where $\omega_i$ are digital frequency variables that define a frequency location of each frequency band and the weighted sum of $c_i\omega_i$ define the desired frequency to which the IMD correction signal is translated.

In some embodiments, the desired frequency to which the IMD correction signal is translated is a baseband frequency that, after subsequent upconversion, results in the IMD correction signal being located at the RF location of the specific IMD product. In some other embodiments, the desired frequency to which the IMD correction signal is translated is an intermediate frequency that, after subsequent upconversion, results in the IMD correction signal being located at the RF location of the specific IMD product. In some other embodiments, the desired frequency to which the IMD correction signal is translated is the RF location of the specific IMD product.

In some embodiments, the method further comprises generating, from the two or more frequency band input signals, two or more predistorted frequency band input signals, respectively, located at desired frequencies for the two or more predistorted frequency band input signals that correspond to RF locations of carriers of the two or more frequency bands of the concurrent multi-band signal. The method further comprises combining the two or more predistorted frequency band input signals and the IMD correction signal to provide a combined signal. In some embodiments, the method further comprises upconverting the combined signal to provide the concurrent multi-band signal.

Embodiments of a concurrent multi-band transmitter system for compensating for one or more specific IMD products in the concurrent multi-band transmitter system are also disclosed. In some embodiments, the concurrent multi-band transmitter system comprises IMD Digital Predistortion (DPD) circuitry operable to generate an IMD correction signal for a specific IMD product as a function of two or more frequency band input signals for two or more frequency bands of a concurrent multi-band signal, the IMD product being an arbitrary IMD product. The concurrent multi-band transmitter system further comprises tuning circuitry operable to frequency translate the IMD correction signal to a desired frequency that corresponds to a RF location of the specific IMD product, wherein the concurrent multi-band transmitter system is operable to, after frequency translation of the IMD correction signal to the desired frequency, utilize the IMD correction signal to compensate for the specific IMD product.

In some embodiments, the IMD product is a non-simple odd-order IMD product. In some other embodiments, the IMD product is an even-order IMD product.

In some embodiments, the IMD DPD circuitry is operable to generate the IMD correction signal for the specific IMD product in accordance with:

$$IMD\_PRODUCT(n) = AB,$$

where $$A = [\Pi_{i=1}^{N} \hat{x}_i^{|c_i|}(n-d_i)],$$

$$B = [\Sigma_{j=1}^{M} \varphi_j \beta_j \{|x_1(n-\tilde{d}_1)|, |x_2(n-\tilde{d}_2)|, \ldots, |x_N(n-\tilde{d}_N)|\}],$$

$c_i$ are signed integer values that define the specific IMD product, $d_i$ is a parameter that controls relative delay of the two or more frequency band input signals, $\tilde{d}_i$ is a parameter that controls relative delay of envelope signals for the two or more frequency band input signals, $\beta_j$ is an N-dimensional basis function set with M members that span a respective N-dimensional input space, $\varphi_j$ are complex coefficients for each set member of the N-dimensional basis function set, and $$\hat{x}_i(n) = \begin{cases} x_i(n) \text{ for } c_i \geq 0, \\ x_i^*(n) \text{ for } c_i < 0. \end{cases}$$

Further, in some embodiments, the tuning circuitry is operable to frequency translate the IMD correction signal to the desired frequency that corresponds to the RF location of the specific IMD product in accordance with:

$$\text{FREQ\_TRANS\_IMD\_PRODUCT}(n) = ABe^{j(c_1\omega_1 c_2\omega_2 + \ldots + c_N\omega_N)n},$$

where $\omega_i$ are digital frequency variables that define a frequency location of each frequency band and the weighted sum of $c_i\omega_i$ define the desired frequency to which the IMD correction signal is translated.

In some embodiments, in order to generate the IMD correction signal for the specific IMD product, the IMD DPD circuitry is operable to generate a plurality of component signals of the IMD correction signal for the specific IMD product, each component signal of the plurality of component signals being generated in accordance with:

$$\text{IMD\_PRODUCT\_COMPONENT}(n) = AB,$$

where $$A = [\Pi_{i=1}^{N} \hat{x}_i^{|c_i|}(n-d_i)],$$

$$B = [\Sigma_{j=1}^{M} \varphi_j \beta_j \{|x_1(n-\tilde{d}_1)|, |x_2(n-\tilde{d}_2)|, \ldots, |x_N(n-\tilde{d}_N)|\}],$$

$c_i$ are signed integer values that define the specific IMD product, $d_i$ is a parameter that controls relative delay of the two or more frequency band input signals, $\tilde{d}_i$ is a parameter that controls relative delay of envelope signals for the two or more frequency band input signals, $\beta_j$ is an N-dimensional basis function set with M members that span a respective N-dimensional input space, $\varphi_j$ are complex coefficients for each set member of the N-dimensional basis function set, $$\hat{x}_i(n) = \begin{cases} x_i(n) & \text{for } c_i \geq 0, \\ x_i^*(n) & \text{for } c_i < 0, \end{cases}$$

and values of $d_i$ and $\tilde{d}_i$ are different for each component signal of the plurality of component signals. In order to generate the IMD correction signal for the specific IMD product, the IMD DPD circuitry is further operable to combine the plurality of component signals to provide the IMD correction signal for the specific IMD product. Further, in some embodiments, the tuning circuitry is operable to frequency translate the IMD correction signal to the desired frequency that corresponds to the RF location of the specific IMD product in accordance with:

$$\text{FREQ\_TRANS\_IMD\_PRODUCT}(n) = ABe^{j(c_1\omega_1 + c_2\omega_2 + \ldots + c_N\omega_N)n},$$

where $\omega_i$ are digital frequency variables that define a frequency location of each frequency band and the weighted sum of $c_i\omega_i$ define the desired frequency to which the IMD correction signal is translated.

In some embodiments, the desired frequency to which the IMD correction signal is translated is a baseband frequency that, after subsequent upconversion, results in the IMD correction signal being located at the RF location of the specific IMD product. In some other embodiments, the desired frequency to which the IMD correction signal is translated is an intermediate frequency that, after subsequent upconversion, results in the IMD correction signal being located at the RF location of the specific IMD product. In some other embodiments, the desired frequency to which the IMD correction signal is translated is the RF location of the specific IMD product.

In some embodiments, the concurrent multi-band transmitter system further comprises DPD circuitry operable to generate, from the two or more frequency band input signals, two or more predistorted frequency band input signals, respectively, located at desired frequencies for the two or more predistorted frequency band input signals that correspond to RF locations of carriers of the two or more frequency bands of the concurrent multi-band signal. The concurrent multi-band transmitter system further comprises combining circuitry operable to combine the two or more predistorted frequency band input signals and the IMD correction signal to provide a combined signal. In some embodiments, the concurrent multi-band transmitter system further comprises upconversion circuitry operable to upconvert the combined signal to provide the concurrent multi-band signal.

In some embodiments, a concurrent multi-band transmitter for compensating for one or more specific IMD products in a concurrent multi-band transmitter system is adapted to generate an IMD correction signal for a specific IMD product as a function of two or more frequency band input signals for two or more frequency bands of a concurrent multi-band signal, the IMD product being an arbitrary order IMD product. The concurrent multi-band transmitter is further adapted to frequency translate the IMD correction signal to a desired frequency that corresponds to a RF location of the specific IMD product and, after frequency translating the IMD correction signal to the desired frequency, utilize the IMD correction signal to compensate for the specific IMD product.

In some embodiments, a concurrent multi-band transmitter system for compensating for one or more specific IMD products in a concurrent multi-band transmitter system comprises a generating module, a frequency translating module, and a utilizing module. The generating module is operable to generate an IMD correction signal for a specific IMD product as a function of two or more frequency band input signals for two or more frequency bands of a concurrent multi-band signal, the IMD product being an arbitrary order IMD product. The frequency translating module is operable to frequency translate the IMD correction signal to a desired frequency that corresponds to a RF location of the specific IMD product. The utilizing module is operable to, after frequency translating the IMD correction signal to the desired frequency, utilize the IMD correction signal to compensate for the specific IMD product.

Those skilled in the art will appreciate the scope of the present disclosure and realize additional aspects thereof after reading the following detailed description of the embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

FIG. 1 is a table of Intermodulation Distortion (IMD) product frequency locations for one example of a concurrent dual-band system;

DETAILED DESCRIPTION

The embodiments set forth below represent information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Systems and methods are disclosed herein for selectively targeting an Intermodulation Distortion (IMD) product(s) for elimination by generating the relevant predistortion products as a function of separate frequency band input signals for a concurrent multi-band transmitter system. The selected IMD product(s) can be even or odd-order products of arbitrary order (i.e., arbitrary order IMD product(s)). Within the context of an adaptive loop that observes the specific IMD product(s), the predistortion terms are adjusted to maximize the effectiveness of the IMD cancellation. After generation, the IMD correction signal(s) is placed at the IMD product frequency location(s) before transmission through a Power Amplifier (PA) of the concurrent multi-band transmitter system.

The embodiments disclosed herein have several distinct advantages. For instance, embodiments of the present disclosure perform Digital Predistortion (DPD) for a specific IMD product(s) that need cancellation or for which cancellation is desired in a targeted manner. This, in turn, leads to certain implementation benefits such as, e.g., potentially lower resource utilization because resources are not wasted on IMD products that do not need cancellation and potentially reduced bandwidth and sample rate requirements, which in turn reduces computational complexity. Embodiments of the present disclosure are applicable to even or odd-order products of any arbitrary order. Further, embodiments of the present disclosure can be extended to an arbitrary number of two or more frequency bands. Further, embodiments of the present disclosure can be employed in a flexible manner, either directly as additional terms in a multi-dimensional DPD system or as a separate DPD subsystem that supports a pre-existing DPD system which cannot correct IMD products. Embodiments of the present disclosure also offer enhanced cancellation performance by incorporating an adaption loop.

Figure 8:
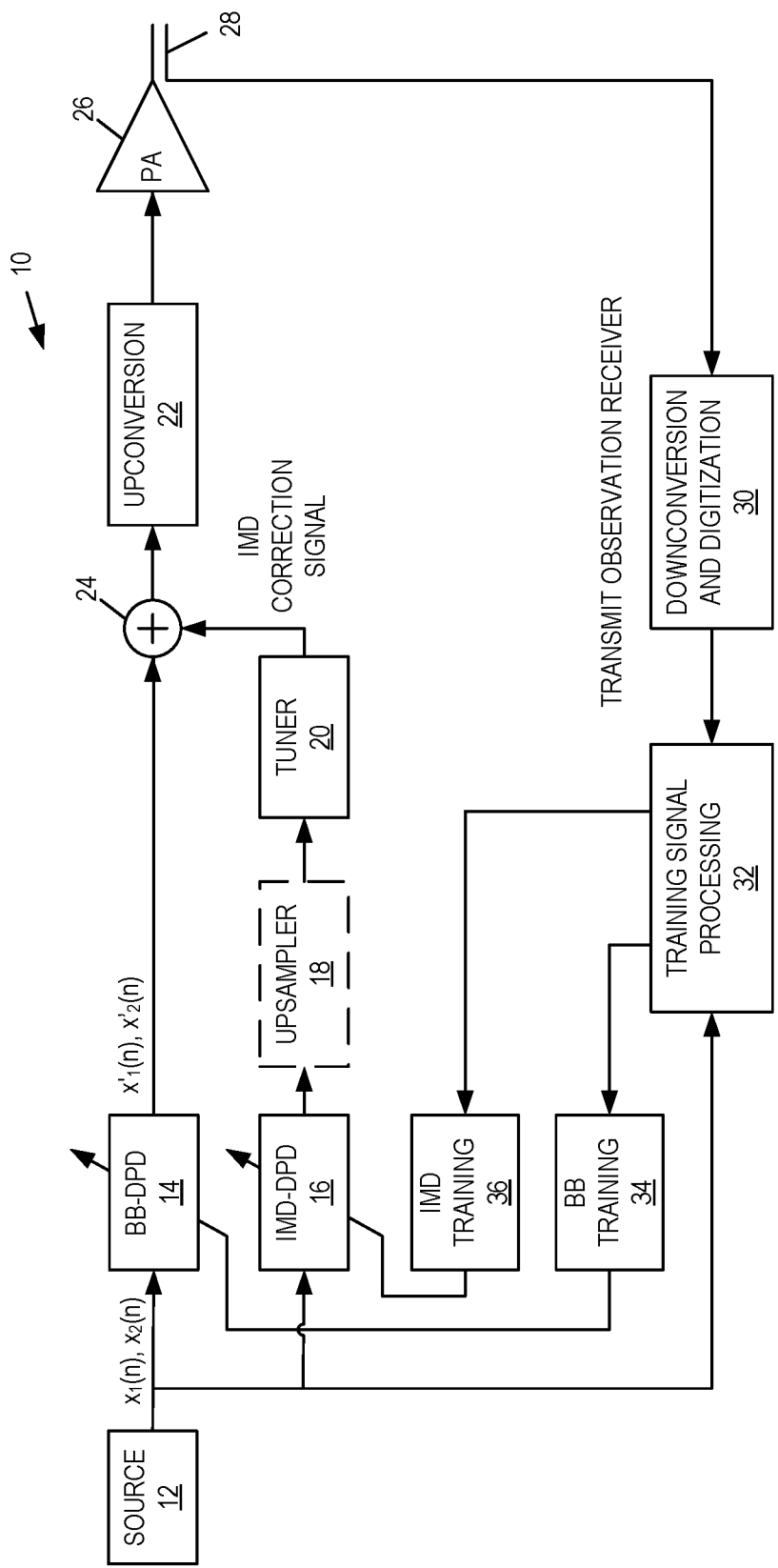
FIGS. 8 and 9 illustrate two non-limiting examples of a concurrent multi-band transmitter system in which embodiments of the present disclosure may be implemented.
Figure 9:
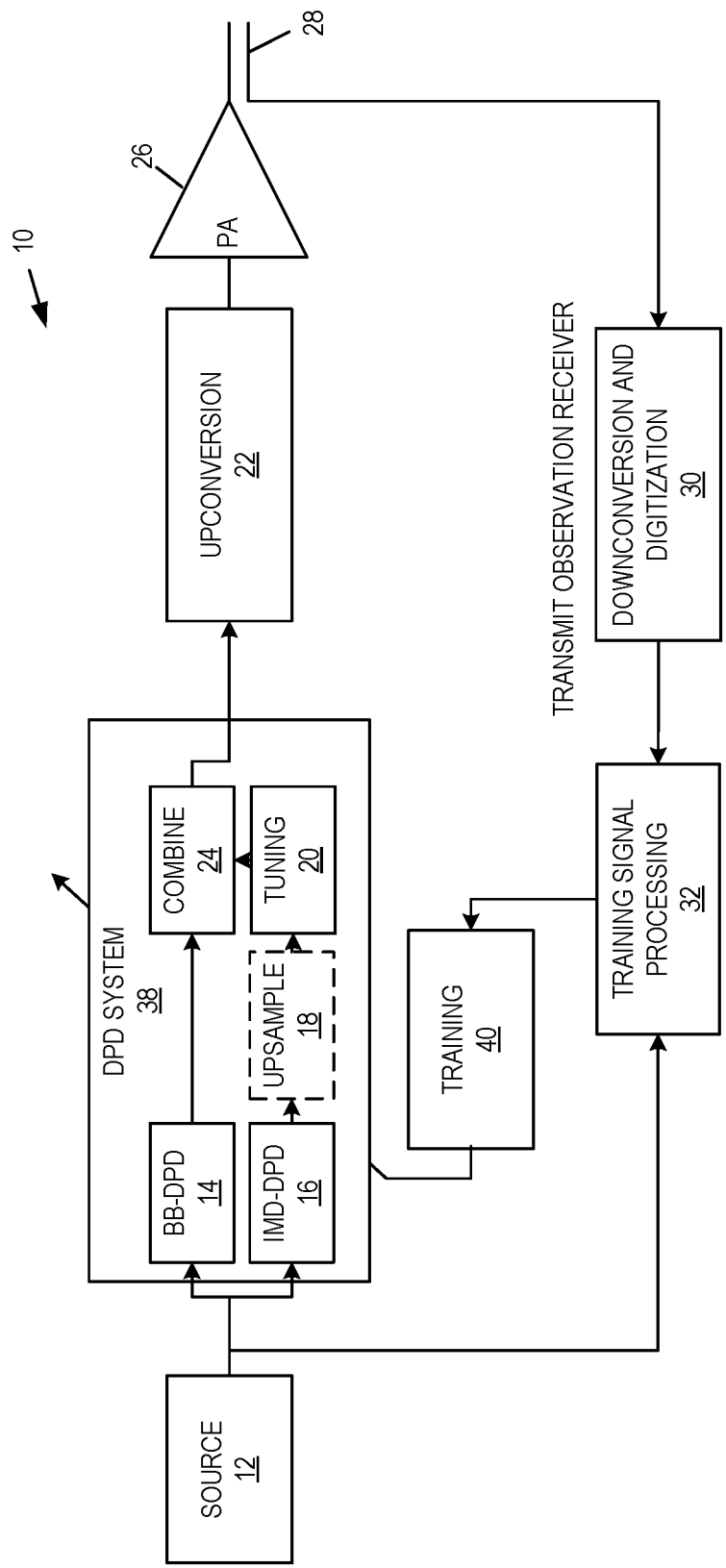

In this regard, FIGS. 8 and 9 illustrate two non-limiting examples of a concurrent multi-band transmitter system 10 in which embodiments of the present disclosure may be implemented. In these examples, the concurrent multi-band transmitter system 10 is a concurrent dual-band transmitter system; however, the embodiments disclosed herein can be extended to any arbitrary number of two or more frequency bands. In FIG. 8, the concurrent multi-band transmitter system 10 includes a source 12 that provides frequency band input signals $x_1(n)$ and $x_2(n)$ for the two frequency bands of the concurrent dual-band signal to be transmitted. In this example, each of the frequency band input signals $x_1(n)$ and $x_2(n)$ is centered at 0 hertz (Hz). However, the present disclosure is not limited thereto.

A Baseband Digital Predistorter (BB-DPD) 14, which may also be referred to herein as a BB-DPD actuator or BB-DPD circuitry, operates to digitally predistort the frequency band input signals $x_1(n)$ and $x_2(n)$ to provide predistorted frequency band input signals $x'_1(n)$ and $x'_2(n)$. The BB-DPD 14 uses, e.g., any conventional BB-DPD scheme. For example, the BB-DPD 14 may use the dual-band DPD architecture as described in U.S. Pat. No. 9,252,718, entitled LOW COMPLEXITY DIGITAL PREDISTORTION FOR CONCURRENT MULTI-BAND TRANSMITTERS, or in U.S. Pat. No. 9,385,762, entitled LINEARIZATION OF INTERMODULATION BANDS FOR CONCURRENT DUAL-BAND POWER AMPLIFIERS, both of which are hereby incorporated by reference for their teachings on a DPD architecture.

An IMD Digital Predistorter (IMD-DPD) 16, an optional upsampler 18 (also referred to herein as upsampling circuitry), and a tuner 20 (also referred to herein as tuning circuitry) operate to generate an IMD correction signal for a specific IMD product(s), as described below in detail. As discussed above, the IMD-DPD 16 generates a baseband IMD correction signal that is optionally upsampled to the sampling rate used for the predistorted frequency band input signals $x'_1(n)$ and $x'_2(n)$ and tuned, by the tuner 20, to a desired frequency. Note that while illustrated separately for clarity and ease of discussion, the tuner 20 may be implemented within the IMD-DPD 16. In this example, the desired frequency is a desired baseband frequency that, after upconversion by upconversion circuitry 22, is located at the frequency location of the specific IMD product(s) to be cancelled. Note, however, that in some other embodiments, the predistorted frequency band input signals $x'_1(n)$ and $x'_2(n)$ are at Intermediate Frequency (IF) and the IMD correction signal is tuned to the appropriate IF frequency. In some other embodiments, the predistorted frequency band input signals $x'_1(n)$ and $x'_2(n)$ are at Radio Frequency (RF) and the IMD correction signal is tuned to the RF frequency of the specific IMD product(s) being cancelled (in which case the upconversion circuitry 22 is not needed).

In this example, the predistorted frequency band input signals $x'_1(n)$ and $x'_2(n)$ and the IMD correction signal are combined (i.e., added) by combining circuitry 24 to provide a combined signal. Here, the combined signal is a concurrent dual-band signal centered at 0 Hz (i.e., a baseband signal). The combined signal is upconverted to RF by the upconversion circuitry 22 and amplified by a PA 26 for transmission.

In this embodiment, the concurrent multi-band transmitter system 10 includes separate training loops for the BB-DPD 14 and the IMD-DPD 16. In this regard, a coupler 28 couples a transmit observation receiver to the output of the PA 26.

The transmit observation receiver includes downconversion and digitization circuitry 30 that downconverts and digitizes the feedback signal from the coupler 28 to provide a baseband feedback signal. Training signal processing circuitry 32 operates to process the frequency band input signals and the baseband feedback signal to provide error signals that are provided to the Baseband (BB) training circuitry 34 and IMD training circuitry 36, respectively. In general, the training signal processing circuitry 32 time-aligns the frequency band input signals and the baseband feedback signal and generates error signals for the BB training circuitry 34 and the IMD training circuitry 36 based on a difference between the frequency band input signals or a combined version of the frequency band input signals and the baseband feedback signal. Based on the error signals, the BB training circuitry 34 updates complex coefficients provided as input to the BB-DPD 14, and the IMD training circuitry 36 updates complex coefficients provided as input to the IMD-DPD 16, as will be appreciated by one of skill in the art. The BB training circuitry 34 and the IMD training circuitry 36 operate in accordance with any suitable training scheme such as, e.g., Least Mean Square (LMS) or least squares. Note that, while separate error signals are provided to the BB training circuitry 34 and the IMD training circuitry 36 in the illustrated example of FIG. 8, a single error signal may alternatively be provided to both the BB training circuitry 34 and the IMD training circuitry 36 in some other implementations.

In the example of FIG. 8, the IMD-DPD 16 and the IMD training circuitry 36 are separate from the BB-DPD 14 and the BB training circuitry 34. As one example implementation, the BB-DPD 14 and the BB training circuitry 34 are implemented on one ASIC, and the IMD-DPD 16 and the IMD training circuitry 36 are implemented on another ASIC. This may be desirable when the IMD-DPD 16 is provided as an add on feature for an existing transmitter system.

FIG. 9 illustrates another example of the concurrent multi-band transmitter system 10 in which the BB-DPD 14 and the IMD-DPD 16 are implemented in a single DPD system 38 and training of the BB-DPD 14 and the IMD-DPD 16 is performed by a single training circuit 40. Otherwise, the operation is the same.

Now, the description turns to the details of the IMD-DPD 16 and the tuner 20 and, in particular, to the generation of the IMD correction signal for cancelling a specific IMD product(s).

As shown in the Background, the IMD products can be defined in terms of the separate band signals that make up the composite input signal. This can be extended for an arbitrary order nonlinear term (with envelope dependence) of the form:

Equation 7—General Arbitrary Order Nonlinearity $$y(n) = x^P(n) x^{*Q}(n),$$

where P and Q are integers, P>Q, and the order of the nonlinear term is given by P+Q. For a multi-band configuration with N bands, the composite input signal is given by:

Equation 8—Multi-Band Input Signal $$x(n) = x_1(n) e^{j\omega_1 n} + x_2(n) e^{j\omega_2 n} + \ldots + x_N(n) e^{j\omega_N n},$$

where $x_1(n), x_2(n), \ldots, x_N(n)$ are the input signals for band "1," band "2," . . . , band "N" respectively, and $\omega_1, \omega_2, \ldots, \omega_N$ are the digital frequency variables that describe the frequency location of each band. Then, by substituting Equation 8 into Equation 7, one can obtain all the IMD products at all frequency locations for a given P, Q, and N. If only a specific IMD product is to be addressed, then one will only be concerned with the distortion products that occur at a specific frequency, where the arbitrary order IMD frequency location is:

Equation 9—Arbitrary Order IMD Frequency Location $$f_{IMD\_Target} = c_1 f_1 + c_2 f_2 + \ldots + c_N f_N,$$

where $c_1, c_2, \ldots, c_N$ are signed integer valued coefficients as before. Then, when considering different values for P and Q, the general form of the IMD product located at $f_{IMD\_Target}$ can be derived to be of the form:

$$IMD(n, c_1, \ldots, c_N) = \left[ \sum_{p_1=0}^{\infty} \sum_{p_2=0}^{\infty} \ldots \sum_{p_N=0}^{\infty} \alpha_{p_1, p_2, \ldots, p_N} \prod_{i=1}^{N} \hat{x}_i^{|c_i|}(n) |x_i(n)|^{p_i} \right]$$
$$e^{j(c_1 \omega_1 + c_2 \omega_2 + \ldots + c_N \omega_N) n},$$

where $\alpha_{p_1, p_2, \ldots, p_N}$ is a constant scale factor, and where $$\hat{x}_i(n) = \begin{cases} x_i(n) \text{ for } c_i \geq 0, \\ x_i^*(n) \text{ for } c_i < 0. \end{cases}$$

Note that the $p_i$ terms are shown to have an infinite upper bound in the summations in Equation 10, but when considering a practical PA implementation, the upper bounds will be finite and limited by the effective nonlinearity order of the PA.

Figure 10:
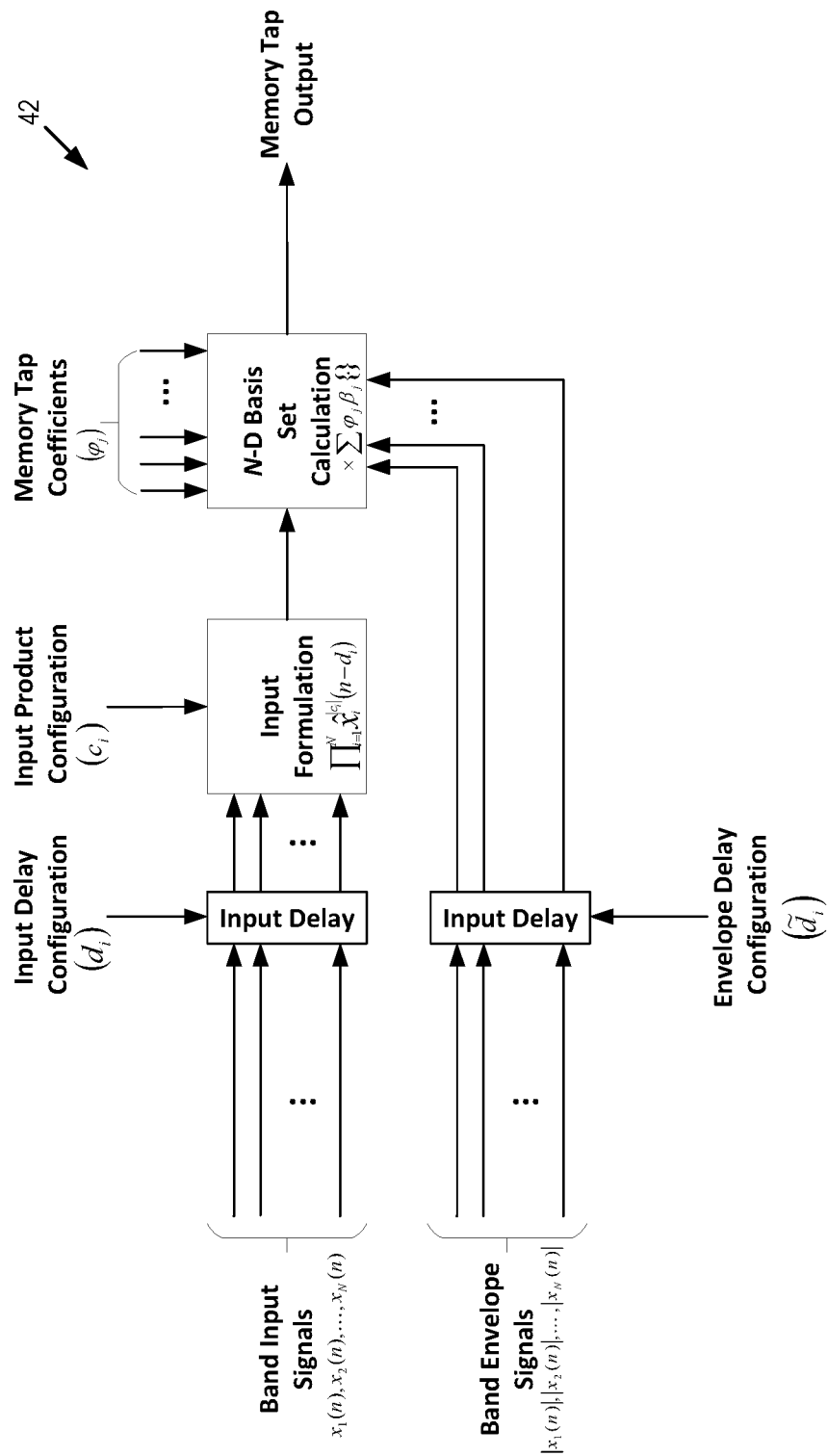
FIG. 10 illustrates a memory tap according to some embodiments of the present disclosure.

Regarding the architecture of the IMD-DPD 16 and the tuner 20, in order to predistort to compensate for the IMD product given in Equation 10, the IMD-DPD 16 and the tuner 20 need to synthesize terms of a similar form (and their corresponding inverse). The IMD-DPD 16 and the tuner 20 implement terms of the general form:

Equation 11—General DPD Correction Signal Terms $$IMD\_DPD\_TERM(n) = [\Pi_{i=1}^{N} \hat{x}_i^{|c_i|}(n-d_i)]$$
$$[\Sigma_{j=1}^{M} \varphi_j \beta_j \{|x_1(n-\tilde{d}_1)|, |x_2(n-\tilde{d}_2)|, \ldots, |x_N(n-\tilde{d}_N)|\}] e^{j(c_1 \omega_1 + c_2 \omega_2 + \ldots + c_N \omega_N) n},$$

where the parameters $d_i$ control the relative delay of the frequency band input signals $x_i$, the parameters $\tilde{d}_i$ control the relative delay of the frequency band input envelope signals $|x_i|$, $\beta_j$ is an N-dimensional basis function set with M members that spans the N-dimensional input space, and where the parameters $\varphi_j$ are the corresponding complex coefficients for each set member. The N-dimensional basis function set can be simply and efficiently formed from the tensor products of traditional one dimensional basis functions such as polynomials or splines. An example of a polynomial based two-dimensional basis function set is given by:

Equation 12—Example Two-Dimensional Polynomial Basis Set $$\beta\{|x_1(n)|, |x_2(n)|\} \in |x_1(n)|^r |x_2(n)|^s, \text{ for } r=0, \ldots, R \text{ and } s=0, \ldots, S$$

where R and S specify the maximum order of the one dimensional polynomials. Similarly, in some embodiments, the basis set can be defined as a tensor product of spline functions as derived in [4]. This type of basis set can be efficiently implemented in hardware. For a unique combination of delay settings (e.g., $d_i$ and $\tilde{d}_i$), the basis set and their corresponding complex coefficients are referred to as a memory tap 42. This basic building block of the memory tap 42 is formed as shown in FIG. 10.

Figure 11:
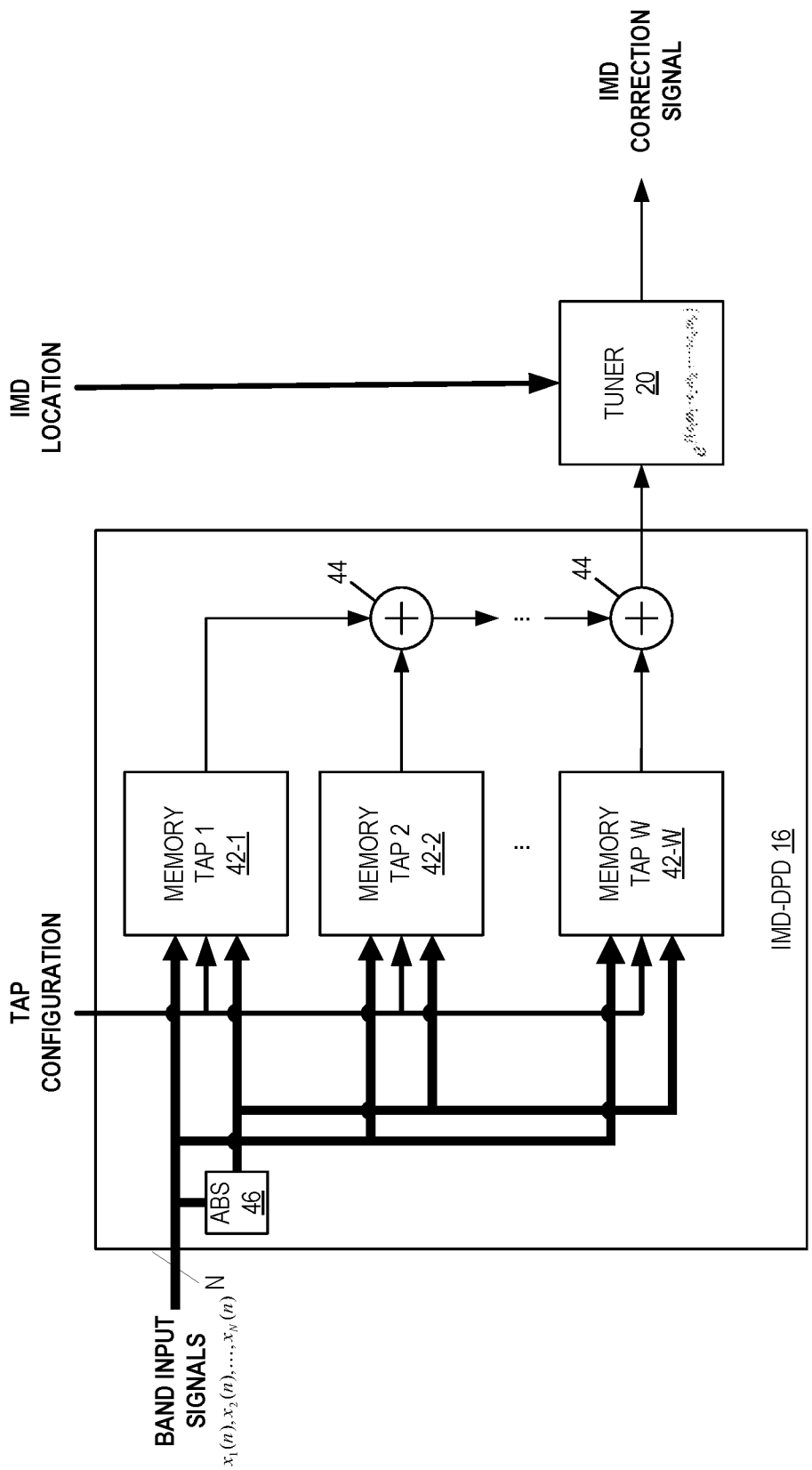
FIG. 11 illustrates one example embodiment of the IMD DPD of FIGS. 8 and 9 that includes multiple memory taps according to some embodiments of the present disclosure.

Typically, a collection of W memory taps will be used to correct a specific IMD product. The outputs of these memory taps 42 are summed together and then frequency translated to the appropriate (relative) baseband frequency. FIG. 11 illustrates one example embodiment of the IMD-DPD 16 and the tuner 20, where the IMD-DPD 16 includes memory taps 42-1 through 42-W, summation circuitry 44 that sums the outputs of the memory taps 42-1 through 42-W, and an absolute function circuit 46 that generates the envelope signals from the frequency band input signals. Note that the upsampler 18 is omitted for clarity. Each memory tap 42 is configured with a separate tap configuration. Referring to Equation 11 above, the tap configuration includes parameters $d_i$ and $\tilde{d}_i$.

Note that one possible method of frequency translation that has an efficient hardware is a Coordinate Rotation Digital Computer (CORDIC) tuner. In other words, in some embodiments, the tuner 20 is a CORDIC tuner.

Also note that the tuner 20 tunes the IMD correction signal to a desired frequency that corresponds to the frequency location of the IMD product to be cancelled. In some embodiments, the desired frequency to which the tuner 20 tunes the IMD correction signal is a baseband frequency that, after upconversion by the upconversion circuitry 22, results in the IMD correction signal being located at the RF frequency location of the IMD product to be cancelled. In some other embodiments, the desired frequency to which the tuner 20 tunes the IMD correction signal is an IF that, after upconversion by the upconversion circuitry 22, results in the IMD correction signal being located at the RF frequency location of the IMD product to be cancelled. In some other embodiments, the desired frequency to which the tuner 20 tunes the IMD correction signal is the RF frequency location of the IMD product to be cancelled.

Returning briefly to FIG. 8, separate adaptation loops are used to adapt the BB-DPD 14 and the IMD-DPD 16. For this scenario, the BB-DPD 14 is, at least in some embodiments, realized using conventional techniques. The BB-DPD 14 may not have any IMD correction capability. The IMD-DPD 16 operates to compensate for a specific IMD product(s). The IMD-DPD 16 only contains IMD specific terms as shown FIGS. 8 and 9. Note that the IMD-DPD 16 can potentially operate at a lower sampling rate than the BB-DPD 14, so an additional upsampling operation may be required to convert the IMD-DPD output to the same sampling rate as the output of the BB-DPD 14. Prior to combining with the output of the BB-DPD actuator, the IMD-DPD output is tuned to the appropriate frequency (relative to baseband) by the tuner 20.

Figure 2:
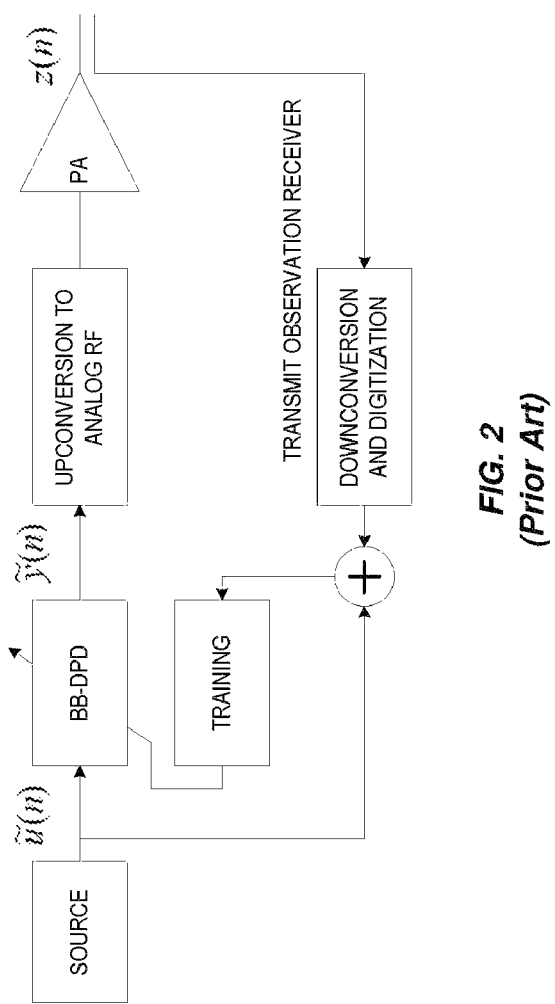
FIG. 2 illustrates a traditional baseband Digital Predistortion (DPD) architecture.
Figure 3:
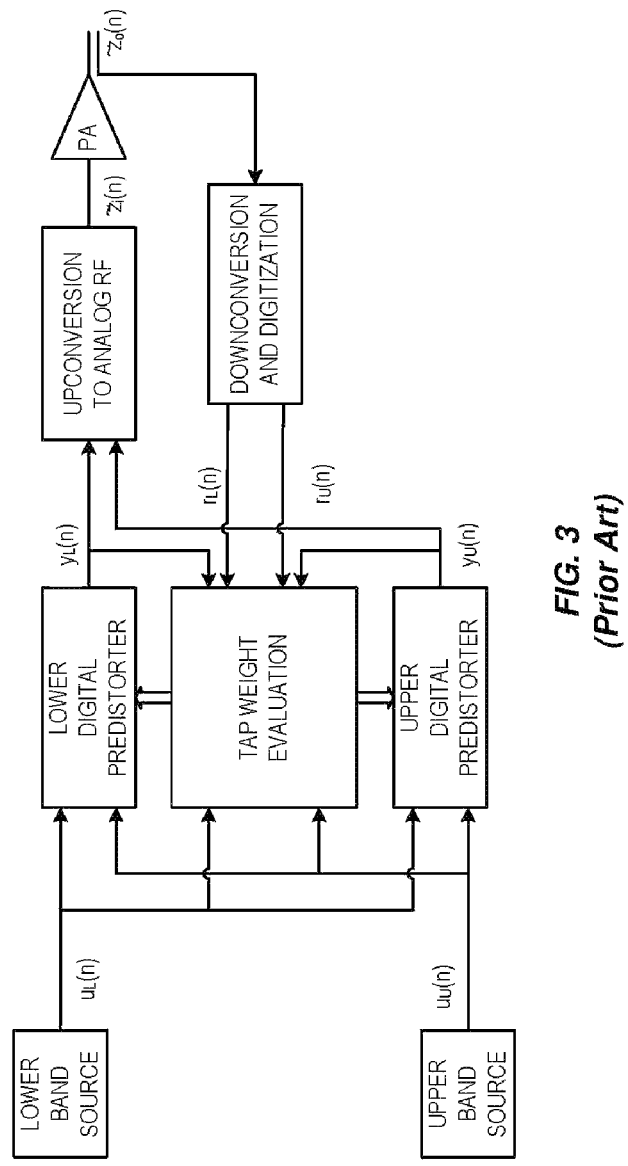
FIG. 3 illustrates a known multi-dimensional DPD architecture.
Figure 4:
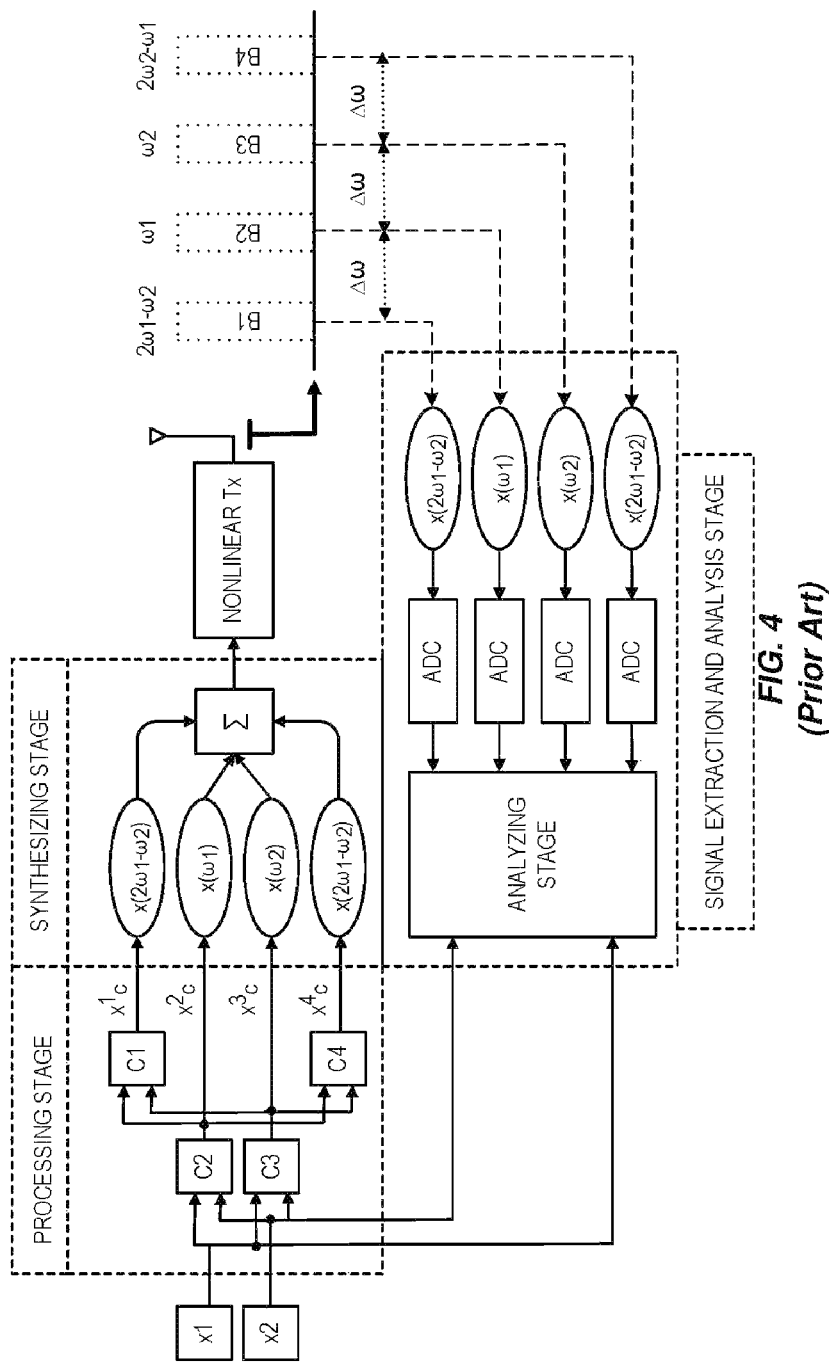
FIG. 4 illustrates a known channel-selective DPD architecture.
Figure 5:
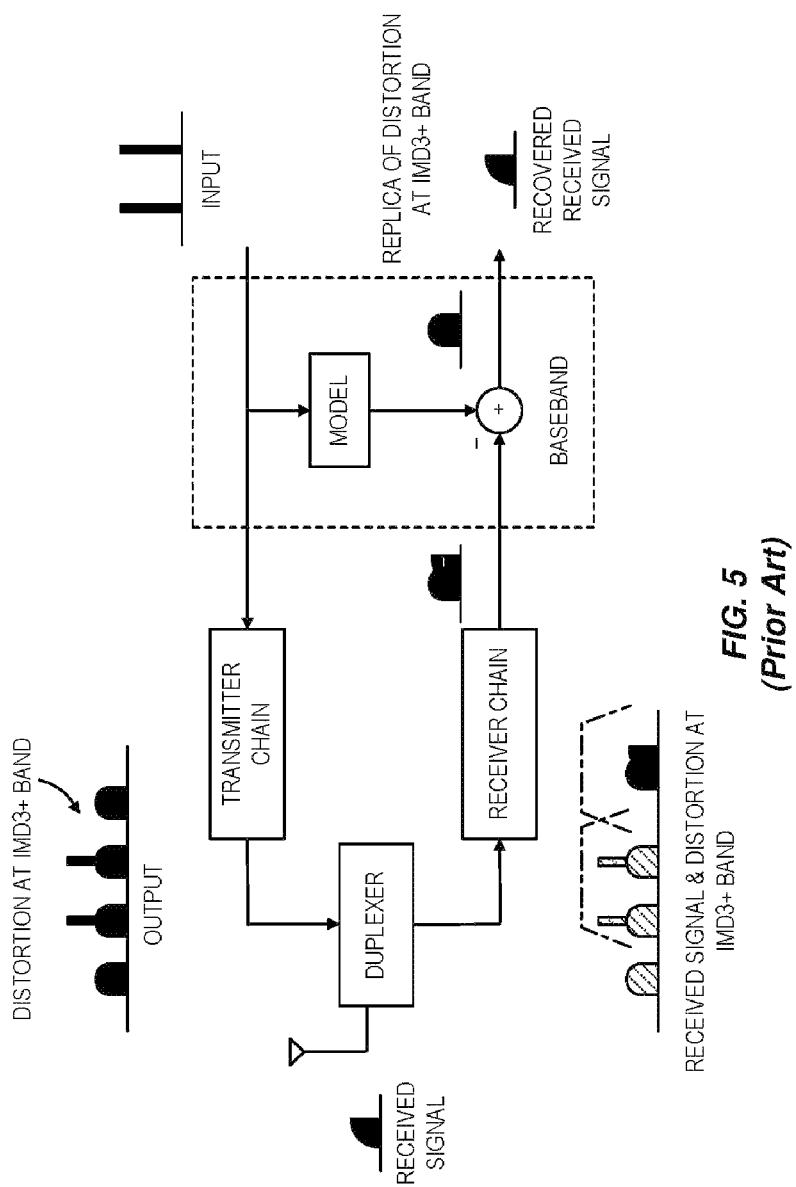
FIG. 5 illustrates a known architecture for suppressing transmitter leakage in a current dual-band system.
Figure 6:
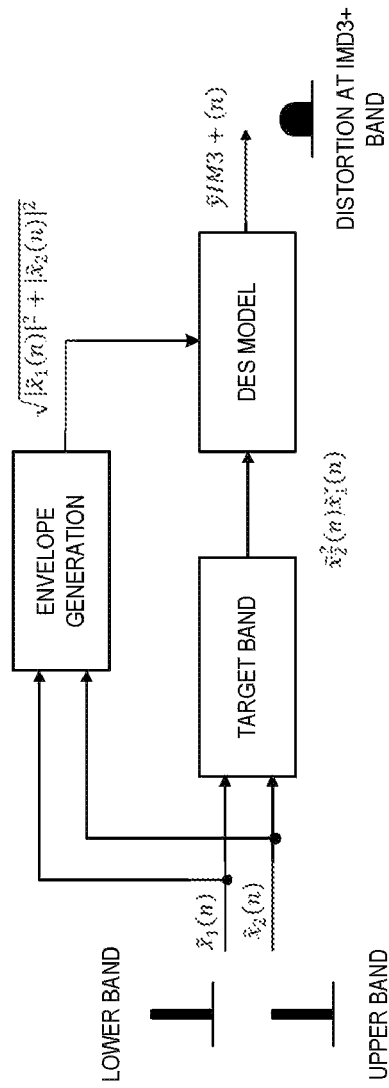
FIG. 6 illustrates the subtraction of a IMD product from the received signals in the system of FIG. 5.
Figure 7:
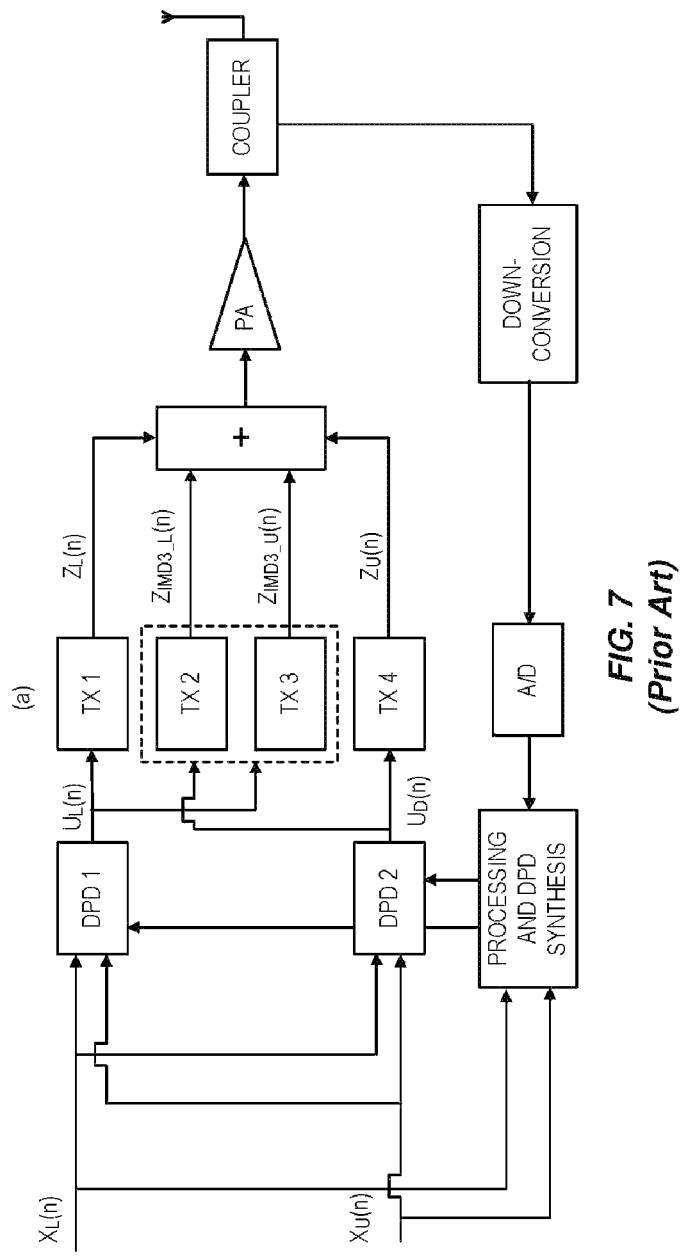
FIG. 7 illustrates a known augmented dual-band DPD architecture with predictive injection.

Now, returning briefly to FIG. 9, if using a multi-dimensional DPD system, then the IMD correction terms can be directly included with the conventional memory taps within the same actuator. In other words, the DPD system 38 can be implemented by a number of memory taps where the IMD correction terms can be directly included in the memory taps along with the conventional DPD correction terms. Consequently, the training circuit 40 can be implemented as a training subsystem from a typical feedback loop (e.g., LMS or least squares), which can be employed by simply generating additional basis function inputs. In this way, one can still use the conventional feedback loop architecture as shown in FIG. 3.

Figure 12:
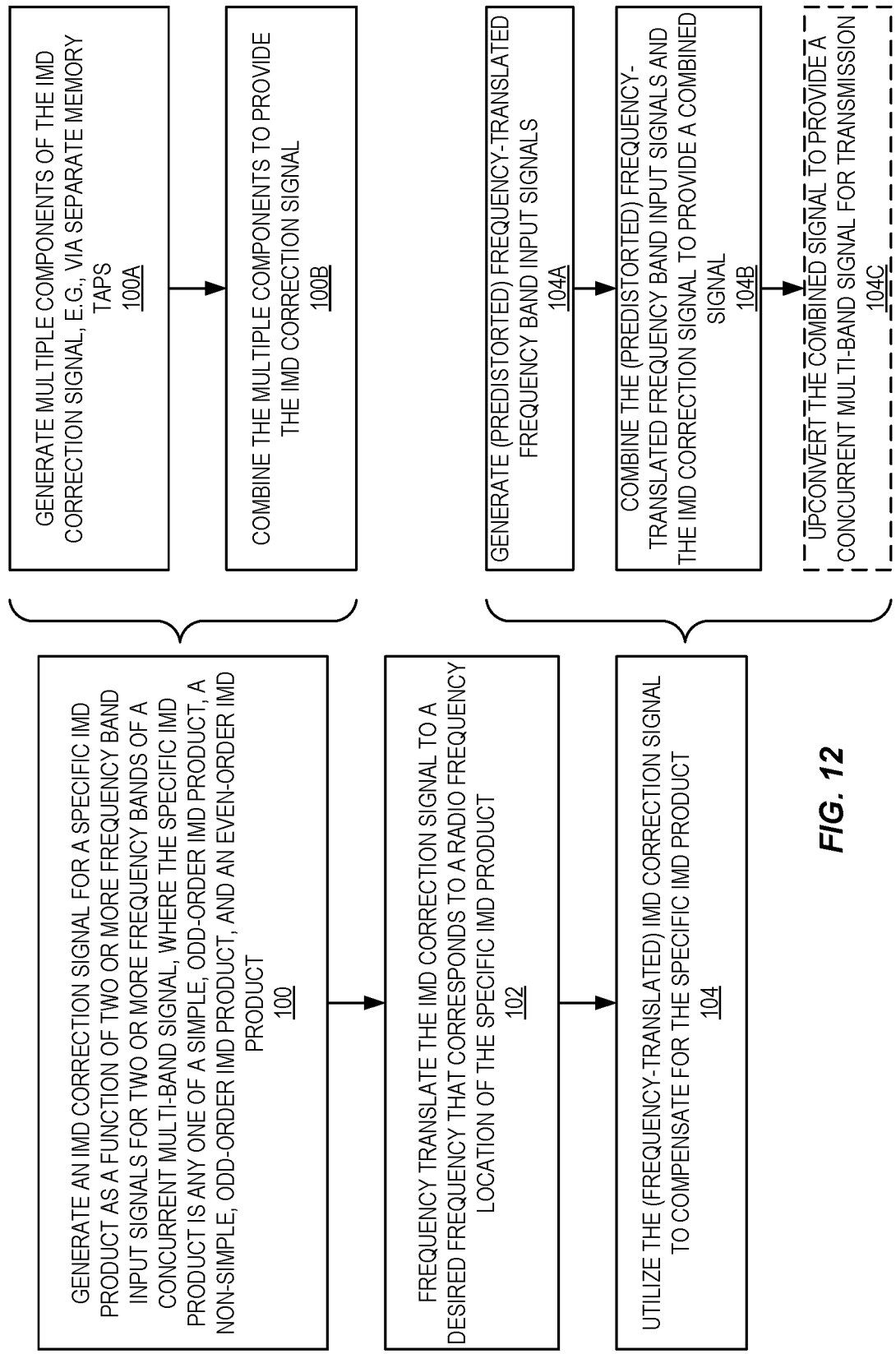
FIG. 12 is a flow chart that illustrates a process for selectively generating an IMD correction signal for a specific IMD product and using the IMD correction signal to compensate for the specific IMD product according to some embodiments of the present disclosure.

FIG. 12 is a flow chart that illustrates a process for selectively generating an IMD correction signal for a specific IMD product and using the IMD correction signal to compensate for the specific IMD product according to some embodiments of the present disclosure. This process is performed by a concurrent multi-band transmitter system such as, e.g., the concurrent multi-band transmitter system 10 illustrated in FIGS. 8 and 9. As such, the concurrent multi-band transmitter system 10 will be used for this discussion.

As illustrated, the concurrent multi-band transmitter system 10, and in particular the IMD-DPD 14, generates an IMD correction signal for a specific IMD product as a function of the frequency band input signals for the frequency bands of the concurrent multi-band signal to be transmitted, as described above (step 100). In particular, prior to frequency translation, the IMD correction signal is, at least in some embodiments, generated in accordance with Equation 11 and, in particular, in accordance with:

$$\text{IMD\_PRODUCT}(n) = AB,$$

where $$A = [\Pi_{i=1}^{N} \hat{x}_i^{|c_i|}(n - d_i)],$$

$$B = [\Sigma_{j=1}^{M} \varphi_j \beta_j \{|x_1(n-\tilde{d}_1)|, |x_2(n-\tilde{d}_2)|, \ldots, |x_N(n-\tilde{d}_N)|\}],$$

$c_i$ are signed integer values that define the specific IMD product, $d_i$ is a parameter that controls relative delay of the two or more frequency band input signals, $\tilde{d}_i$ is a parameter that controls relative delay of envelope signals for the two or more frequency band input signals, $\beta_j$ is an N-dimensional basis function set with M members that span a respective N-dimensional input space, $\varphi_j$ are complex coefficients for each set member of the N-dimensional basis function set, and $$\hat{x}_i(n) = \begin{cases} x_i(n) & \text{for } c_i \geq 0, \\ x_i^*(n) & \text{for } c_i < 0. \end{cases}$$

If multiple memory taps are used as, e.g., in the embodiment of FIG. 11, then the IMD-DPD 14 generates multiple components of the IMD correction signal (i.e., multiple memory tap outputs) (step 100A) and then combines these components to provide the IMD correction signal (step 100B). Each component is generated in accordance with Equation 11 above and, in particular, in accordance with:

$$\text{IMD\_PRODUCT}(n) = AB,$$

where $$A = [\Pi_{i=1}^{N} \hat{x}_i^{|c_i|}(n - d_i)],$$

$$B = [\Sigma_{j=1}^{M} \varphi_j \beta_j \{|x_1(n-\tilde{d}_1)|, |x_2(n-\tilde{d}_2)|, \ldots, |x_N(n-\tilde{d}_N)|\}],$$

$c_i$ are signed integer values that define the specific IMD product, $d_i$ is a parameter that controls relative delay of the two or more frequency band input signals, $\tilde{d}_i$ is a parameter that controls relative delay of envelope signals for the two or more frequency band input signals, $\beta_j$ is an N-dimensional basis function set with M members that span a respective N-dimensional input space, $\varphi_j$ are complex coefficients for each set member of the N-dimensional basis function set, and $$\hat{x}_i(n) = \begin{cases} x_i(n) \text{ for } c_i \geq 0, \\ x_i^*(n) \text{ for } c_i < 0. \end{cases}$$

Note that values of $d_i$ and $\tilde{d}_i$ are different (or at least separately configurable) for each component of the IMD correction signal.

The concurrent multi-band transmitter system 10, and in particular the tuner 20, frequency translates the IMD correction signal to a desired frequency that corresponds to the RF location of the specific IMD product to be cancelled (step 102). As discussed above, in some embodiments, the desired frequency to which the IMD correction signal is tuned is a baseband frequency that, after upconversion by the upconversion circuitry 22, results in the IMD correction signal being located at the RF frequency location of the IMD product to be cancelled. In some other embodiments, the desired frequency to which the IMD correction signal is tuned is an IF that, after upconversion by the upconversion circuitry 22, results in the IMD correction signal being located at the RF frequency location of the IMD product to be cancelled. In some other embodiments, the desired frequency to which the IMD correction signal is tuned is the RF frequency location of the IMD product to be cancelled.

The concurrent multi-band transmitter system 10 then utilizes the IMD correction signal to compensate for the specific IMD product (step 104). In general, the IMD correction signal is combined into the main signal path either prior to or after upconversion but prior to amplification by the PA 26 such that the IMD correction signal cancels the specific IMD product at the output of the PA 26. As an example, in the embodiments of FIGS. 8 and 9, the concurrent multi-band transmitter system 10 generates predistorted and frequency-translated versions of the frequency band input signals (step 104A). Note that the predistortion of the BB-DPD 14 is optional in which case the frequency band input signals are frequency translated to the appropriate frequencies without predistortion. The (predistorted) frequency-translated frequency band inputs are combined with the IMD correction signal to provide a combined signal (step 104B). The combined signal is a concurrent multi-band baseband (or alternatively IF) signal in which the frequency band input signals and the IMD correction signal have all been placed appropriate frequencies relative to one another. The combined signal is then upconverted (if needed) to provide a concurrent multi-band signal at RF that is then amplified for transmission (step 104C). Note that the upconversion step is optional, as indicated by the dashed lines, in embodiments in which the frequency band input signals and the IMD correction signal are combined at RF.

Figure 13:
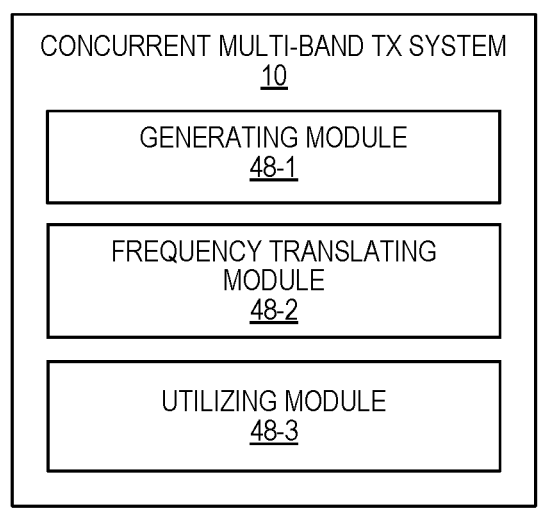
FIG. 13 illustrates a concurrent multi-band transmitter system according to another embodiment of the present disclosure.

FIG. 13 illustrates the concurrent multi-band transmitter system 10 according to some other embodiments of the present disclosure. In this example, the concurrent multi-band transmitter system 10 includes a number of modules 48, each of which is implemented in software. In particular, the concurrent multi-band transmitter system 10 includes a generating module 48-1, a frequency translating module 48-2, and a utilizing module 48-3. The generating module 48-1 is operable to generate an IMD correction signal for a specific IMD product as a function of two or more frequency band input signals for two or more frequency bands of a concurrent multi-band signal, the IMD product being an arbitrary order IMD product, as described above. The frequency translating module 48-2 is operable to frequency translate the IMD correction signal to a desired frequency that corresponds to a RF location of the specific IMD product, as described above. The utilizing module 48-3 is operable to, after frequency translating the IMD correction signal to the desired frequency, utilize the IMD correction signal to compensate for the specific IMD product, as described above. Note that, while not illustrated, the concurrent multi-band transmitter system 10 may include additional modules such as, for example, a DPD module that operates to digitally predistort the frequency band input signals as described above, one or more training modules for training BB-DPD and IMD-DPD as described above, etc.

The following acronyms are used throughout this disclosure.

2D-DPD Two Dimensional Digital Predistortion
ASIC Application Specific Integrated Circuit
BB Baseband
BB-DPD Baseband Digital Predistorter
CORDIC Coordinate Rotation Digital Computer
DPD Digital Predistortion
DSP Digital Signal Processing
GMP Generalized Memory Polynomial
Hz Hertz
IC Integrated Circuit
IF Intermediate Frequency
IMD3 Third Order Intermodulation Distortion
IMD Intermodulation Distortion
IMD-DPD Intermodulation Distortion Digital Predistorter
LMS Least Mean Square
LUT Lookup Table
MHz Megahertz
PA Power Amplifier
RF Radio Frequency Those skilled in the art will recognize improvements and modifications to the embodiments of the present disclosure. All such improvements and modifications are considered within the scope of the concepts disclosed herein and the claims that follow.

LIST OF REFERENCES

[1] D. R. Morgan et al., "A Generalized Memory Polynomial Model for Digital Predistortion of RF Power Amplifiers," IEEE Transactions on Signal Processing, Vol. 54, No. 10, October 2006.
[2] You-Jiang Liu et al., "Digital Predistortion for Concurrent Dual-Band Transmitters Using 2-D Modified Memory Polynomials," IEEE Transactions on Microwave Theory and Techniques," Vol. 61, No. 1, January 2013.
[3] Naveen Naraharisetti et al. "2D Cubic Spline Implementation for Concurrent Dual-Band System," International Microwave Symposium (IMS), 2013 IEEE MTT-S International, Jun. 2-7, 2013.
[4] International Publication No. WO 2016/203294 A1, published Dec. 22, 2016.
[5] Naveen Naraharisetti et al., "Efficient Least-Squares 2-D-Cubic Spline for Concurrent Dual-Band Systems," IEEE Transactions on Microwave Theory and Techniques, Vol. 63, No. 7, July 2015.
[6] Seyed AidinBassam et al, "Channel-Selective Multi-Cell Digital Predistorter for Multi-Carrier Transmitters," IEEE Transactions on Communications, Vol. 60, No. 8, August 2012.
[7] Chao Yu et al., "Modeling and Suppression of Transmitter Leakage in Concurrent Dual-band Transceivers with Carrier Aggregation," Microwave Symposium (IMS), 2015 IEEE MTT-S International, May 17-22, 2015.

[8] Abubaker Abdelhafiz et al, "Augmented Dual-Band Digital Predistorter for Reducing Cross-Band Intermodulation Distortion Using Predictive Injection Technique," IEEE Transactions on Microwave Theory and Techniques, Vol. 64, No. 11, November 2016.

What is claimed is:

1. A method of compensating for one or more specific Intermodulation Distortion, IMD, products in a concurrent multi-band transmitter system, comprising:
   generating an IMD correction signal for a specific IMD product as a function of two or more frequency band input signals for two or more frequency bands of a concurrent multi-band signal, the specific IMD product being an arbitrary order IMD product comprising a non-simple odd-order IMD product or an even-order IMD product;
   frequency translating the IMD correction signal to a desired frequency that corresponds to a radio frequency location of the specific IMD product; and
   after frequency translating the IMD correction signal to the desired frequency, utilizing the IMD correction signal to compensate for the specific IMD product.

2. The method of claim 1 wherein generating the IMD correction signal for the specific IMD product comprises generating the IMD correction signal for the specific IMD product in accordance with:

$$IMD\_PRODUCT(n)=AB,$$

where $$A=[\Pi_{i=1}^{N} \hat{x}_i^{|c_i|}(n-d_i)],$$

$$B=[\Sigma_{j=1}^{M} \varphi_j \beta_j \{|x_1(n-\tilde{d}_1)|, |x_2(n-\tilde{d}_2)|, \ldots, |x_N(n-\tilde{d}_N)|\}],$$

$c_i$ are signed integer values that define the specific IMD product, $d_i$ is a parameter that controls relative delay of the two or more frequency band input signals, $\tilde{d}_i$ is a parameter that controls relative delay of envelope signals for the two or more frequency band input signals, $\beta_j$ is an N-dimensional basis function set with M members that span a respective N-dimensional input space, $\varphi_j$ are complex coefficients for each set member of the N-dimensional basis function set, and $$\hat{x}_i(n) = \begin{cases} x_i(n) \text{ for } c_i \geq 0, \\ x_i^*(n) \text{ for } c_i < 0. \end{cases}$$

3. The method of claim 2 wherein frequency translating the IMD correction signal to the desired frequency that corresponds to the radio frequency location of the specific IMD product comprises frequency translating the IMD correction signal to the desired frequency that corresponds to the radio frequency location of the specific IMD product in accordance with:

$$FREQ\_TRANS\_IMD\_PRODUCT(n)= ABe^{j(c_1\omega_1 + c_2\omega_2 + \ldots + c_N\omega_N)n},$$

where $\omega_i$ are digital frequency variables that define a frequency location of each frequency band and a weighted sum of $c_i\omega_i$ defines the desired frequency to which the IMD correction signal is translated.

4. The method of claim 1 wherein generating the IMD correction signal for the specific IMD product comprises:
   generating a plurality of component signals of the IMD correction signal for the specific IMD product, each component signal of the plurality of component signals being generated in accordance with:

$$IMD\_PRODUCT(n)=AB,$$

where $$A=[\Pi_{i=1}^{N} \hat{x}_i^{|c_i|}(n-d_i)],$$

$$B=[\Sigma_{j=1}^{M} \varphi_j \beta_j \{|x_1(n-\tilde{d}_1)|, |x_2(n-\tilde{d}_2)|, \ldots, |x_N(n-\tilde{d}_N)|\}],$$

$c_i$ are signed integer values that define the specific IMD product, $d_i$ is a parameter that controls relative delay of the two or more frequency band input signals, $\tilde{d}_i$ is a parameter that controls relative delay of envelope signals for the two or more frequency band input signals, $\beta_j$ is an N-dimensional basis function set with M members that span a respective N-dimensional input space, $\omega_j$ are complex coefficients for each set member of the N-dimensional basis function set, $$\hat{x}_i(n) = \begin{cases} x_i(n) \text{ for } c_i \geq 0, \\ x_i^*(n) \text{ for } c_i < 0, \end{cases}$$

and values of $d_i$ and $\tilde{d}_i$ are different for each component signal of the plurality of component signals; and
   combining the plurality of component signals to provide the IMD correction signal for the specific IMD product.

5. The method of claim 4 wherein frequency translating the IMD correction signal to the desired frequency that corresponds to the radio frequency location of the specific IMD product comprises frequency translating the IMD correction signal to the desired frequency that corresponds to the radio frequency location of the specific IMD product in accordance with:

$$FREQ\_TRANS\_IMD\_PRODUCT(n)= ABe^{j(c_1\omega_1 + c_2\omega_2 + \ldots + c_N\omega_N)n},$$

where $\omega_i$ are digital frequency variables that define a frequency location of each frequency band and the weighted sum of $c_i\omega_i$ defines the desired frequency to which the IMD correction signal is translated.

6. The method of claim 1 wherein the desired frequency to which the IMD correction signal is translated is a baseband frequency that, after subsequent upconversion, results in the IMD correction signal being located at the radio frequency location of the specific IMD product.

7. The method of claim 1 wherein the desired frequency to which the IMD correction signal is translated is an intermediate frequency that, after subsequent upconversion, results in the IMD correction signal being located at the radio frequency location of the specific IMD product.

8. The method of claim 1 wherein the desired frequency to which the IMD correction signal is translated is the radio frequency location of the specific IMD product.

9. The method of claim 1 further comprising:
   generating, from the two or more frequency band input signals, two or more predistorted frequency band input signals, respectively, located at desired frequencies for the two or more predistorted frequency band input signals that correspond to radio frequency locations of carriers of the two or more frequency bands of the concurrent multi-band signal; and
   combining the two or more predistorted frequency band input signals and the IMD correction signal to provide a combined signal.

10. The method of claim 9 further comprising upconverting the combined signal to provide the concurrent multi-band signal.

11. A concurrent multi-band transmitter system for compensating for one or more specific Intermodulation Distortion, IMD, products in the concurrent multi-band transmitter system, comprising:
   IMD digital predistortion circuitry operable to generate an IMD correction signal for a specific IMD product as a function of two or more frequency band input signals for two or more frequency bands of a concurrent multi-band signal, the specific IMD product being an arbitrary IMD product comprising a non-simple odd-order IMD product or an even-order IMD product; and
   tuning circuitry operable to frequency translate the IMD correction signal to a desired frequency that corresponds to a radio frequency location of the specific IMD product; and
   wherein the concurrent multi-band transmitter system is operable to, after frequency translation of the IMD correction signal to the desired frequency, utilize the IMD correction signal to compensate for the specific IMD product.

12. The concurrent multi-band transmitter system of claim 11 wherein the IMD digital predistortion circuitry is operable to generate the IMD correction signal for the specific IMD product in accordance with:

$$IMD\_PRODUCT(n) = AB,$$

where $$A = [\Pi_{i=1}^{N} \hat{x}_i^{|c_i|}(n - d_i)],$$

$$B = [\Sigma_{j=1}^{M} \varphi_j \beta_j \{|x_1(n-\tilde{d}_1)|, |x_2(n-\tilde{d}_2)|, \ldots, |x_N(n-\tilde{d}_N)|\}],$$

$c_i$ are signed integer values that define the specific IMD product, $d_i$ is a parameter that controls relative delay of the two or more frequency band input signals, $\tilde{d}_i$ is a parameter that controls relative delay of envelope signals for the two or more frequency band input signals, $\beta_j$ is an N-dimensional basis function set with M members that span a respective N-dimensional input space, $\varphi_j$ are complex coefficients for each set member of the N-dimensional basis function set, and $$\hat{x}_i(n) = \begin{cases} x_i(n) \text{ for } c_i \geq 0, \\ x_i^*(n) \text{ for } c_i < 0. \end{cases}$$

13. The concurrent multi-band transmitter system of claim 12 wherein the tuning circuitry is operable to frequency translate the IMD correction signal to the desired frequency that corresponds to the radio frequency location of the specific IMD product in accordance with:

$$FREQ\_TRANS\_IMD\_PRODUCT(n) = ABe^{j(c_1\omega_1 + c_2\omega_2 + \ldots + c_N\omega_N)n},$$

where $\omega_i$ are digital frequency variables that define a frequency location of each frequency band and a weighted sum of $c_i\omega_i$ defines the desired frequency to which the IMD correction signal is translated.

14. The concurrent multi-band transmitter system of claim 11 wherein in order to generate the IMD correction signal for the specific IMD product, the IMD digital predistortion circuitry is operable to:
   generate a plurality of component signals of the IMD correction signal for the specific IMD product, each component signal of the plurality of component signals being generated in accordance with:

$$IMD\_PRODUCT(n) = AB,$$

where $$A = [\Pi_{i=1}^{N} \hat{x}_i^{|c_i|}(n - d_i)],$$

$$B = [\Sigma_{j=1}^{M} \varphi_j \beta_j \{|x_1(n-\tilde{d}_1)|, |x_2(n-\tilde{d}_2)|, \ldots, |x_N(n-\tilde{d}_N)|\}],$$

$c_i$ are signed integer values that define the specific IMD product, $d_i$ is a parameter that controls relative delay of the two or more frequency band input signals, $\tilde{d}_i$ is a parameter that controls relative delay of envelope signals for the two or more frequency band input signals, $\beta_j$ is an N-dimensional basis function set with M members that span a respective N-dimensional input space, $\omega_j$ are complex coefficients for each set member of the N-dimensional basis function set, $$\hat{x}_i(n) = \begin{cases} x_i(n) \text{ for } c_i \geq 0, \\ x_i^*(n) \text{ for } c_i < 0, \end{cases}$$

and values of $d_i$ and $\tilde{d}_i$ are different for each component signal of the plurality of component signals; and
   combine the plurality of component signals to provide the IMD correction signal for the specific IMD product.

15. The concurrent multi-band transmitter system of claim 14 wherein the tuning circuitry is operable to frequency translate the IMD correction signal to the desired frequency that corresponds to the radio frequency location of the specific IMD product in accordance with:

$$FREQ\_TRANS\_IMD\_PRODUCT(n) = ABe^{j(c_1\omega_1 + c_2\omega_2 + \ldots + c_N\omega_N)n},$$

where $\omega_i$ are digital frequency variables that define a frequency location of each frequency band and the weighted sum of $c_i\omega_i$ defines the desired frequency to which the IMD correction signal is translated.

16. The concurrent multi-band transmitter system of claim 11 wherein the desired frequency to which the IMD correction signal is translated is a baseband frequency that, after subsequent upconversion, results in the IMD correction signal being located at the radio frequency location of the specific IMD product.

17. The concurrent multi-band transmitter system of claim 11 wherein the desired frequency to which the IMD correction signal is translated is an intermediate frequency that, after subsequent upconversion, results in the IMD correction signal being located at the radio frequency location of the specific IMD product.

18. The concurrent multi-band transmitter system of claim 11 wherein the desired frequency to which the IMD correction signal is translated is the radio frequency location of the specific IMD product.

19. The concurrent multi-band transmitter system of claim 11 further comprising:
   digital predistortion circuitry operable to generate, from the two or more frequency band input signals, two or more predistorted frequency band input signals, respectively, located at desired frequencies for the two or more predistorted frequency band input signals that correspond to radio frequency locations of carriers of the two or more frequency bands of the concurrent multi-band signal; and combining circuitry operable to combine the two or more predistorted frequency band input signals and the IMD correction signal to provide a combined signal.

20. The concurrent multi-band transmitter system of claim 19 further comprising upconversion circuitry operable to upconvert the combined signal to provide the concurrent multi-band signal.

21. A concurrent multi-band transmitter system for compensating for one or more specific Intermodulation Distortion, IMD, products in a concurrent multi-band transmitter system, wherein the concurrent multi-band transmitter system comprises:

one or more transmitters; and processing circuitry configured to cause the concurrent multi-band transmitter system to:

generate an IMD correction signal for a specific IMD product as a function of two or more frequency band input signals for two or more frequency bands of a concurrent multi-band signal, the IMD product being an arbitrary order IMD product comprising a non-simple odd-order IMD product or an even order IMD product;

frequency translate the IMD correction signal to a desired frequency that corresponds to a radio frequency location of the specific IMD product; and after frequency translating the IMD correction signal to the desired frequency, utilize the IMD correction signal to compensate for the specific IMD product.

* * * * *